United States Patent [19]

Murakami et al.

[11] 4,455,547
[45] Jun. 19, 1984

[54] RESISTIVE ELEMENT FORMED IN A SEMICONDUCTOR SUBSTRATE

[75] Inventors: Kenji Murakami, Yokohama; Seiji Hayashi, Isahaya, both of Japan

[73] Assignee: Tokyo Shibaura Denki Kabushiki Kaisha, Kawasaki, Japan

[21] Appl. No.: 455,837

[22] Filed: Jan. 5, 1983

[30] Foreign Application Priority Data

Jan. 14, 1982 [JP] Japan .................................. 57-4711
Jan. 14, 1982 [JP] Japan .................................. 57-4713

[51] Int. Cl.$^3$ .............................................. H01C 1/02
[52] U.S. Cl. .................................... 338/308; 338/314; 357/51; 357/59
[58] Field of Search ...................... 357/51, 59; 338/13, 338/20, 308, 309, 314

[56] References Cited

U.S. PATENT DOCUMENTS 4,124,933 11/1978 Nicholas ........................ 148/187 X
4,315,239 2/1982 Daniele et al. ..................... 338/308

FOREIGN PATENT DOCUMENTS 2747180 11/1977 Fed. Rep. of Germany .... 357/59 R

OTHER PUBLICATIONS

Lloyd et al., "Polysilicon Resistor Fabrication," IBM Technical Disclosure Bulletin, vol. 23, No. 7A, Dec. 1980, pp. 2811-2812.

"Conduction Properties of Lightly Doped, Polycrystalline Silicon", Solid-State Electronics, vol. 21, pp. 1045-1049 and 1051.

Primary Examiner—Roy N. Envall, Jr.
Assistant Examiner—Christopher N. Sears
Attorney, Agent, or Firm—Finnegan, Henderson, Farabow, Garrett & Dunner

[57] ABSTRACT

A resistive element which is formed in a semiconductor substrate comprises a first semiconductor region which is formed in the semiconductor substrate and in which an impurity is diffused at a first concentration; a second semiconductor region which is connected to the first semiconductor region at one end and in which an impurity is diffused at a second concentration higher than the first impurity concentration; a third semiconductor region which is connected to the first semiconductor region at the other end and in which an impurity is diffused at a third concentration higher than the first impurity concentration; and the second and third semiconductor regions respectively including a portion whose cross section has a smaller area than the area of a boundary defined by the second and third semiconductor region with the first semiconductor region.

6 Claims, 12 Drawing Figures

F I G. 7A
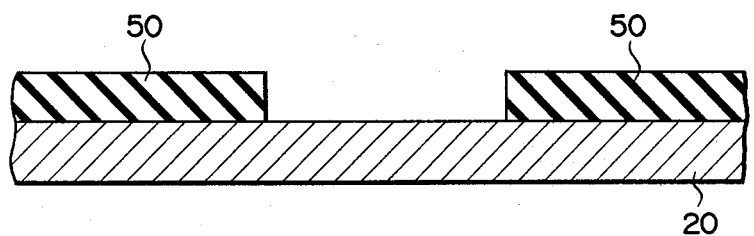
F I G. 7B
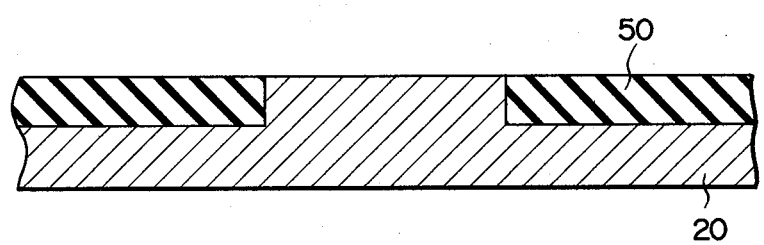
F I G. 7C
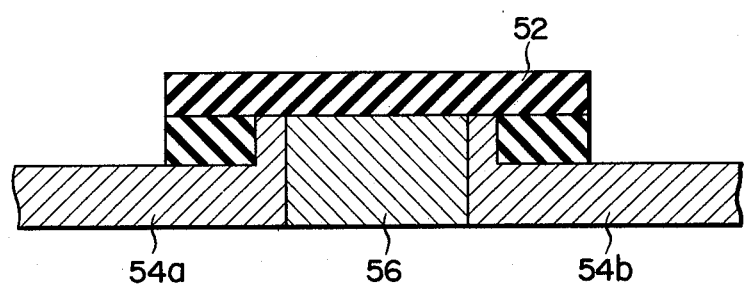

RESISTIVE ELEMENT FORMED IN A SEMICONDUCTOR SUBSTRATE

BACKGROUND OF THE INVENTION

This invention relates to a resistive element formed in a semiconductor substrate.

Preparing a resistive element by diffusing an impurity in a polycrystalline silicon layer is already known. This resistive element comprises a low resistive region in which an impurity is diffused and a high resistive region in which no impurity is diffused. FIGS. 1 and 2 show the conventional resistive element. A low resistive region 12 is constructed by diffusing an impurity with, for example, an SiO$_2$ layer 10 used as a mask. A high resistive region 14 has no impurity diffused therein. When L is taken to denote the length of the mask, and Xj is taken to represent the length in which an impurity is diffused laterally of the conventional resistive element on one side, then the length of the high resistive region 14 is indicated by L-2Xj.

"Conduction Properties of Lightly Doped Polycrystalline Silicon" written by George J. Korsh and Richard S. Muller in "Solid-State Electronics" vol. 22, pp. 1045-1049 and 1051 discloses that when a voltage V is impressed between both terminals of a polycrystalline silicon layer prepared as described above, the current I flowing through said polycrystalline silicon layer is expressed by the following formula:

$$I = C(T)\sinh \frac{qv}{2kTN(L - 2Xj)}$$

I=C(T)sinh qv/2kTN(L-2Xj) where:
C(T)=a constant defined by an absolute temperature T and the potential barrier height of an intergrain
k=Boltzmann's constant
N=the number of grains of polycrystalline silicon per unit length of the resistive element It is seen from the above formula (1) that in a region where low voltage is impressed, the current varies linearly with said voltage; and in a region where high voltage is impressed, the current increases exponentially relative to said voltage.

The resistive element should preferably be actuated in a linear region of the V-I curve for the stabilization of its properties. Therefore, the greater the length L-2Xj of the high resistive region, the broader the voltage range in which the resistive element can be linearly operated. Since, however, the mask length L cannot be extended much due to restrictions resulting from a demand for the large scale integration of a semiconductor device, an attempt is made to reduce the length Xj in which an impurity is diffused laterally of a resistive element. This attempt is effected by decreasing the temperature at which an impurity is diffused and applying an impurity having a small diffusion coefficient. Where, however, the lateral diffusion length Xj of an impurity is defined as that which is reached when the impurity is diffused at a concentration of $10^{17}$cm$^{-3}$, then the lateral diffusion length Xj possible at present measures about 6 microns, making it necessary to further reduce said length Xj.

SUMMARY OF THE INVENTION

It is accordingly the object of this invention to form in a semiconductor substrate a resistive element whose linear property is improved.

To attain the above-mentioned object, this invention provides a resistive element which comprises:
a first semiconductor region formed in a semiconductor substrate with a first impurity concentration;
a second semiconductor region which is formed with a second impurity concentration higher than the first impurity concentration and connected to one end of the first semiconductor region;
a third semiconductor region which is formed with a third impurity concentration higher than the first impurity concentration and connected to the other end of the first semiconductor region; and
said second and third semiconductor regions respectively including a portion having a smaller cross sectional area than the area of a boundary defined by the first semiconductor region and the second and third semiconductor regions.

When an impurity is diffused to form a low resistive region, the resistive element, constructed as described above, enables an impurity to be diffused in a smaller length, thereby extending the length of the high resistive region and consequently improving the linear property of a resistive element.

BRIEF DESCRIPTION OF THE DRAWINGS

Other objects and advantages will be apparent from the following description taken in conjunction with the accompanying drawings in which;

FIGS. 7A through 7C are cross sectional views of the sequential steps of manufacturing a resistive element according to a third embodiment of the present invention.

DETAILED DESCRIPTION OF THE PREFERRED EMBODIMENTS

Figure 1:
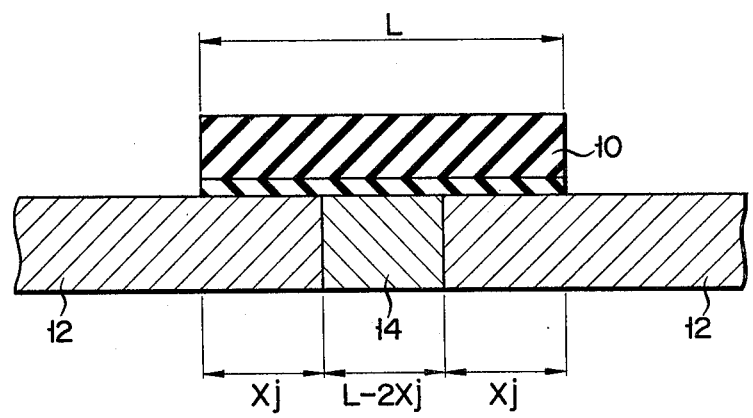
FIG. 1 is a cross sectional view of the conventional resistive element.
Figure 2:
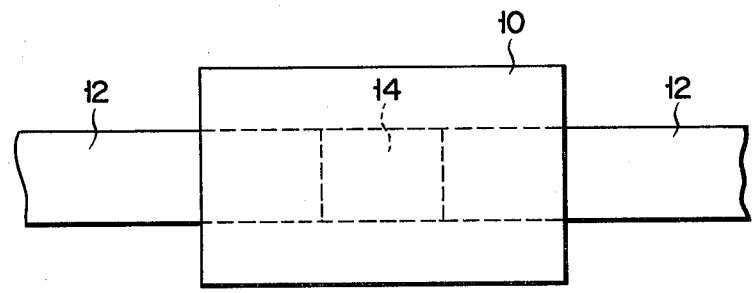
FIG. 2 is a plan view of the resistive element of FIG. 1.
Figure 3:
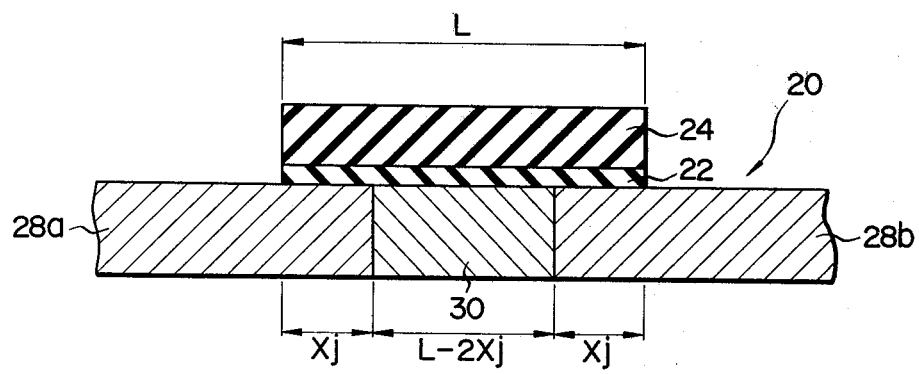
FIG. 3 is a cross sectional view of a resistive element according to a first embodiment of the present invention.
Figure 4:
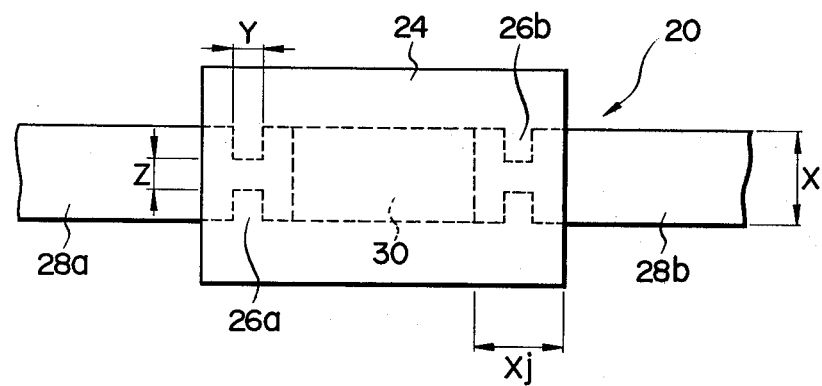
FIG. 4 is a plan view of the resistive element of FIG. 3.

Description is now given with reference to FIGS. 3 and 4 of a resistive element according to a first embodiment of the present invention. A thin SiO$_2$ layer is deposited on the surface of a polycrystalline silicon layer 20. A CVD SiO$_2$ layer, for example, is laid on the thin SiO$_2$ layer. The CVD SiO$_2$ layer and the thin SiO$_2$ layer are selectively removed by the photoengraving process (PEP) to provide an SiO$_2$ layer pattern 22 and CVD SiO$_2$ layer pattern 24.

As shown in FIG. 4, the polycrystalline silicon layer 20 comprises the narrow sections 26a and 26b formed by partial etching. The SiO$_2$ layer pattern 22 and CVD SiO$_2$ layer pattern 24 cover the narrow sections 26a and 26b. Phosphorus, for example, is diffused in the polycrystalline silicon layer 20 with the SiO$_2$ layer pattern 24 used as a mask. The phosphorus is diffused into the deeper region of the polycrystalline silicon layer 20 through the narrow sections 26a and 26b. As a result, those portions of the polycrystalline silicon layer 20 in which the phosphorus is diffused constitute low resistive regions 28a and 28b. That portion of the polycrystalline silicon layer 20 in which the phosphorus is not diffused constitutes a high resistive region. Since the polycrystalline silicon layer 20 has the narrow sections 26a and 26b, the length Xj of the lateral phosphorus diffusion in the low resistive regions 28a and 28b, as measured from the end of the CVD SiO$_2$ layer pattern 24, is smaller than in the conventional resistive element. In other words, the phosphorus impurity is more broadly spread at a smaller concentration after passing through the narrow sections 26a 26b. If the narrow sections 26a and 26b are designed to have a low resistance, then the property of the resistive element is not adversely affected, even though the polycrystalline silicon layer 20 is made narrower in some parts.

When an impurity is diffused in a resistive element through the mask 24 having a prescribed length L in accordance with the method of this invention, then the length L-2Xj of the high resistive region 30 can be extended, thereby broadening the voltage range in which a resistive element can be applied in the linear region. Referring to FIG. 4, it is assumed that the width x of the high resistive region 30 is 10 microns; the length y of the narrow sections 26a and 26b is 2 microns; and the width z of the narrow sections 26a and 26b is 1 micron. Then the diffusion length Xj of the impurity is made about 2 microns shorter than has been possible with the conventional resistive element as measured on the basis of the same manufacturing process.

Figure 5:
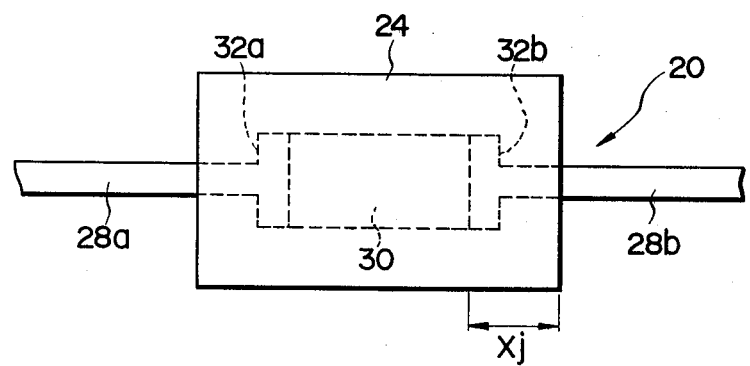
FIG. 5 is a plan view of a modification of the resistive element of FIGS. 3 and 4.

Description is now given, with reference to FIG. 5, of a modification of a resistive element according to the first embodiment. A polycrystalline silicon layer 20 comprises a high resistive region 30 and narrow low resistive regions 28a and 28b. Only the junctions defined by the high resistive region 30 with the narrow low resistive regions 28a and 28b are made wide. An impurity is diffused in the wide polycrystalline silicon layer portion 20 at the narrow sections 28a and 28b through a mask 24 formed on the polycrystalline silicon layer 20, thereby constituting the low resistive regions 28a and 28b. In this case, too, the impurity is widely spread at a lower concentration after passing through the narrow sections 32a and 32b. With the modification of FIG. 5, therefore, the lateral diffusion length Xj of the impurity is also made shorter than in the conventional resistive element.

Figure 6A:
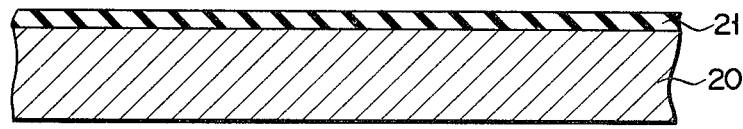
FIGS. 6A through 6D are cross sectional views of the sequential steps of manufacturing a resistive element according to a second embodiment of the invention.
Figure 6B:
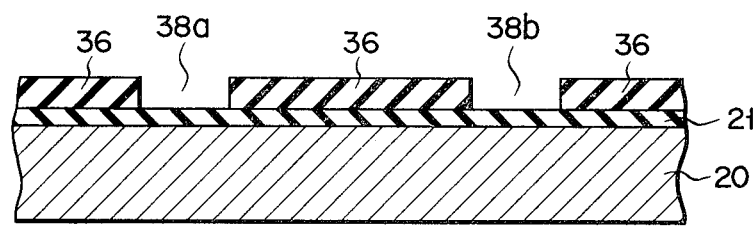
Figure 6C:
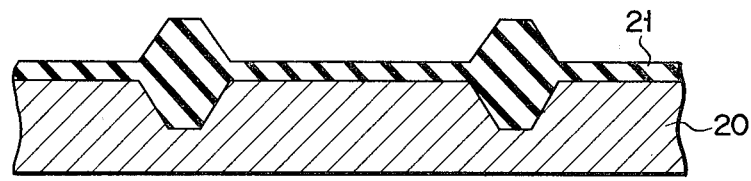
Figure 6D:
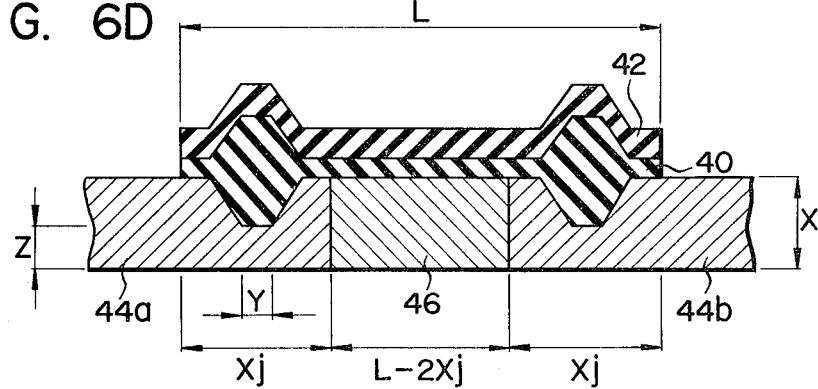

Description is now given with reference to FIGS. 6A through 6D of a resistive element according to a second embodiment of the present invention. FIG. 6D is a cross sectional view of the second embodiment. FIGS. 6A through 6D show the sequential steps of manufacturing this embodiment.

As shown in FIG. 6A, a polycrystalline silicon layer 20 is patterned, and later the surface of the layer 20 is oxidized to produce an SiO$_2$ layer 21. A silicon nitride layer deposited on the SiO$_2$ layer 21 is etched by the photoengraving process to produce silicon nitride patterns 36 and holes 38a and 38b (FIG. 6B). The polycrystalline silicon layer 20 is selectively oxidized through the masks of the silicon nitride patterns 36 (FIG. 6C). During this oxidizing process, those portions of the polycrystalline silicon layer 20 which lie under the holes 38a and 38b are made thinner. Later, as shown in FIG. 6D, a CVD SiO$_2$ layer formed by the CVD process is selectively etched to provide an SiO$_2$ pattern 40 having a length L and CVD SiO$_2$ pattern 42. Phosphorus, for example, is diffused in the resistive layer through the masks of said SiO$_2$ pattern 40 and CVD SiO$_2$ pattern 42, thereby forming low resistive regions 44a and 44b in which the phosphorus is laterally diffused in a length Xj. Those portions of the polycrystalline silicon layer 20 in which no phosphorus is diffused constitutes a high resistive region having a length L-2Xj.

With the second embodiment of FIGS. 6A through 6D, too, the path through which the impurity is diffused has narrower portions. When the diffusion path is widened, the impurity is widely spread at a lower concentration, thereby shortening the lateral diffusion length Xj of the impurity. Referring to FIG. 6D, let it be assumed that X measures 0.6 micron; Y measures 2 microns; and Z measures 0.06 micron. Then the second embodiment of FIGS. 6A through 6D, enables the lateral diffusion length Xj of the impurity to be made about 2 microns shorter than has been possible with the conventional resistive element, thereby improving the linear property of the resistive element.

Description will now be given with reference to FIGS. 7A through 7C of a resistive element according to a third embodiment of the present invention. A mask 50 prepared from, for example, SiO$_2$ or Si$_3$N$_4$ is selectively formed on a polycrystalline silicon layer 20 (FIG. 7A). Another polycrystalline silicon layer is deposited on the polycrystalline silicon layer through the mask 50 (FIG. 7B). A CVD SiO$_2$ layer formed by the CVD process is selectively etched to produce a CVD SiO$_2$ pattern 52 (FIG. 7C). Phosphorus, for example, is diffused with the CVD SiO$_2$ pattern as a mask to provide low resistive regions 54a and 54b and a high resistive region 56. An impurity is laterally diffused over a short length of a resistive element produced through the above-mentioned steps, which, therefore, indicates an excellent linear property.

Obviously, many modifications and variations of the present invention are possible in light of the above teachings. It is therefore to be understood that within the scope of the appended claims, the invention may be practiced otherwise than as specifically described.

What we claim is:
1. A resistive element which comprises:
   a first semiconductor region which is formed in a semiconductor substrate and in which an impurity is diffused at a first concentration;
   a second semiconductor region which is connected at a first boundary to one end of said first semiconductor region, and in which an impurity is diffused at a second concentration higher than said first impurity concentration; and
   said second and third semiconductor regions each including a narrow portion whose cross section area is smaller than the area of said first and second boundaries, respectively.
2. A resistive element according to claim 1, wherein the first, second and third semiconductor regions are prepared from polycrystalline silicon.
3. A resistive element according to claim 2, wherein a portion of said second and third semiconductor regions is produced by selectively etching said polycrystalline silicon layer.

4. A resistive element according the claim 3, wherein said second and third semiconductor regions are formed by diffusing an impurity in the semiconductor substrate through said narrow portions.

5. A resistive element according to claim 2, wherein said narrow portions are produced by selectively oxidizing said polycrystalline silicon layer.

6. A resistive element according to claim 5, wherein said second and third semiconductor regions are produced by diffusing an impurity through said narrow portions.

* * * * *